United States Patent [19]

Wong et al.

[11] Patent Number: 4,489,041
[45] Date of Patent: Dec. 18, 1984

[54] NON PLUGGING FALLING FILM PLASMA REACTOR

[75] Inventors: Franklin S. Wong; Clair E. Hildebrand, both of Morris County, N.J.

[73] Assignee: Allied Corporation, Morristown, N.J.

[21] Appl. No.: 511,368

[22] Filed: Jul. 6, 1983

[51] Int. Cl.³ .............................................. C07G 13/00
[52] U.S. Cl. ................................. 422/186.22; 204/164
[58] Field of Search ...................... 422/186.21, 186.22; 204/164

[56] References Cited

U.S. PATENT DOCUMENTS

| | | | |
|---|---|---|---|
| 3,077,108 | 2/1963 | Gage | 204/164 |
| 3,332,870 | 7/1967 | Orbach | 204/164 |
| 3,390,980 | 7/1968 | Orbach | 422/186.22 |
| 3,481,703 | 12/1969 | Zirngibl | 204/164 |
| 3,668,108 | 6/1972 | Houseman | 422/186.22 |

*Primary Examiner*—John F. Niebling
*Attorney, Agent, or Firm*—Michael J. Weins; Gerhard H. Fuchs; James Riesenfeld

[57] ABSTRACT

An improved apparatus and an associated method for the reduction of low melting point oxides in a falling film plasma reactor is disclosed. The improved torch provides a radiation barrier to avoid premature melting of the reactants that cause clogging of the reactor.

8 Claims, 5 Drawing Figures

NON PLUGGING FALLING FILM PLASMA REACTOR

DESCRIPTION

FIELD OF THE INVENTION

This invention relates to a falling film plasma reactor, and more particularly, to a reactor suitable for use with reactants with low melting points.

BACKGROUND ART

Falling film plasma reactors are frequently used to reduce metallic oxides. In plasma reactors of the falling film type, an arc is struck between a cathode and an anode. The reactants (e.g., metallic oxides and reducing agents such as carbon) are mixed and fed onto the walls of the anode through feedports. The reactants are melted by the heat of the arc and form a film on the anode; this film limits wear of the anode.

Falling film reactors have been employed to reduce metal oxides with high melting points such as $Fe_2O_3$ and $Fe_3O_4$. However, when the lower melting point oxides such as $V_2O_5$ (melting point 800° C.) and $B_2O_3$ (melting point 450° C.) are fed into the reactor, the oxides fuse and plug the reactor feedports. For some low melting point oxides this problem has been overcome in part by prereacting the oxides to form higher melting point oxides. For example, $V_2O_5$ which has a low melting point can be converted to an oxide with a higher melting point, $V_2O_4$. However, other oxides such as $B_2O_3$ cannot be reacted to form higher melting point oxides; and thus these oxides cannot be effectively reduced in falling film plasma reactors.

It is an object of the present invention to provide a falling film plasma reactor which overcomes the problems associated with the reduction of low melting point oxides or other low melting reactants.

SUMMARY OF THE INVENTION

The present invention is for an improved plasma reactor of the falling film type. An improved injection ring is employed which has one or more feedports passing through the injection ring for feeding the reactants into the plasma reactor. The injection ring is positioned between a cathode contained in a plasma gun and an anode onto which the reactants are fed. The injection ring is water cooled and has a cylindrical passage therethrough. The passage has a first section with a first diameter which joins a second section with a second diameter. The first and second sections have a common axis and the diameter of the second section is larger than the diameter of the first section.

The feedports enter the second section of the passage in close proximity to the first section. A radiation barrier is provided which shields the feed ports from the radiation of the plasma. The radiation barrier is a toroid generated about the common axes of the first and second sections of the cylindrical passage. This radiation barrier extends the first passage into the second passage.

Preferably, the improved plasma reactor of the present invention has a swirl gas ring attached to the injection ring. The swirl gas ring has a central passage therethrough which connects to and extends the first section of the passage in the water cool injection ring. Gas injection passages are positioned in the swirl ring to tangentically intersect the central passage of the swirl gas ring thereby creating a vortex in the flow of gas.

LIST OF FIGURES

BEST MODES FOR CARRYING THE INVENTION INTO PRACTICE

Figure 1:
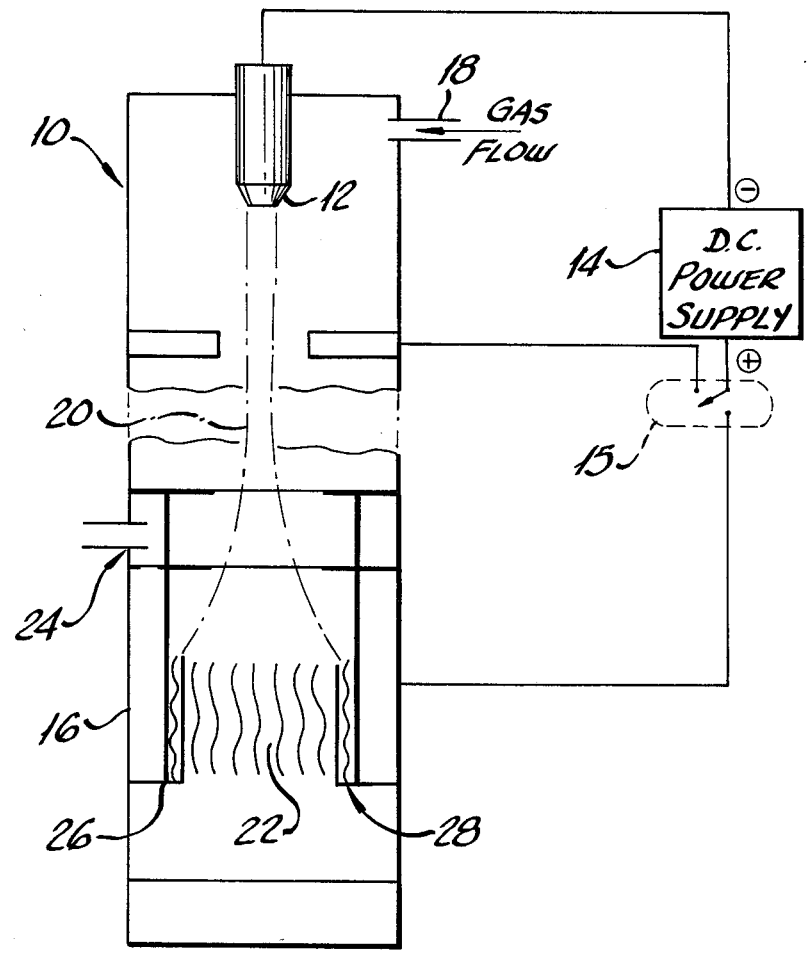
FIG. 1 is a schematic representation of a prior art falling film plasma reactor.

FIG. 1 is a schematic representation of a prior art falling film plasma reactor. The reactor has a plasma gun 10 having a cathode 12 therein. A DC power supply 14 is connected to the cathode 12 and a switch 15 provides alternate connections between a reaction anode 16 and a striking anode 17. A plasma gas supply feed 18 provides gas to the plasma gun 10. An arc is formed between the cathode 12 and the reaction anode 16 by activating the power supply between the cathode 12 and the striking anode 17 and thereafter switches the power supply to the reaction anode 16. The plasma gas is heated and ionized by the arc 20 and forms a plasma zone 22. Reactant feed means 24 are provided above the plasma zone 22 for feeding the reactants onto the inner wall 26 of the reaction anode 16. The reactants fed onto the inner wall 26 of the reaction anode 16 are heated by the plasma zone 22 and form a falling film 28 where the reactants combine to form the desired reaction products.

Figure 2:
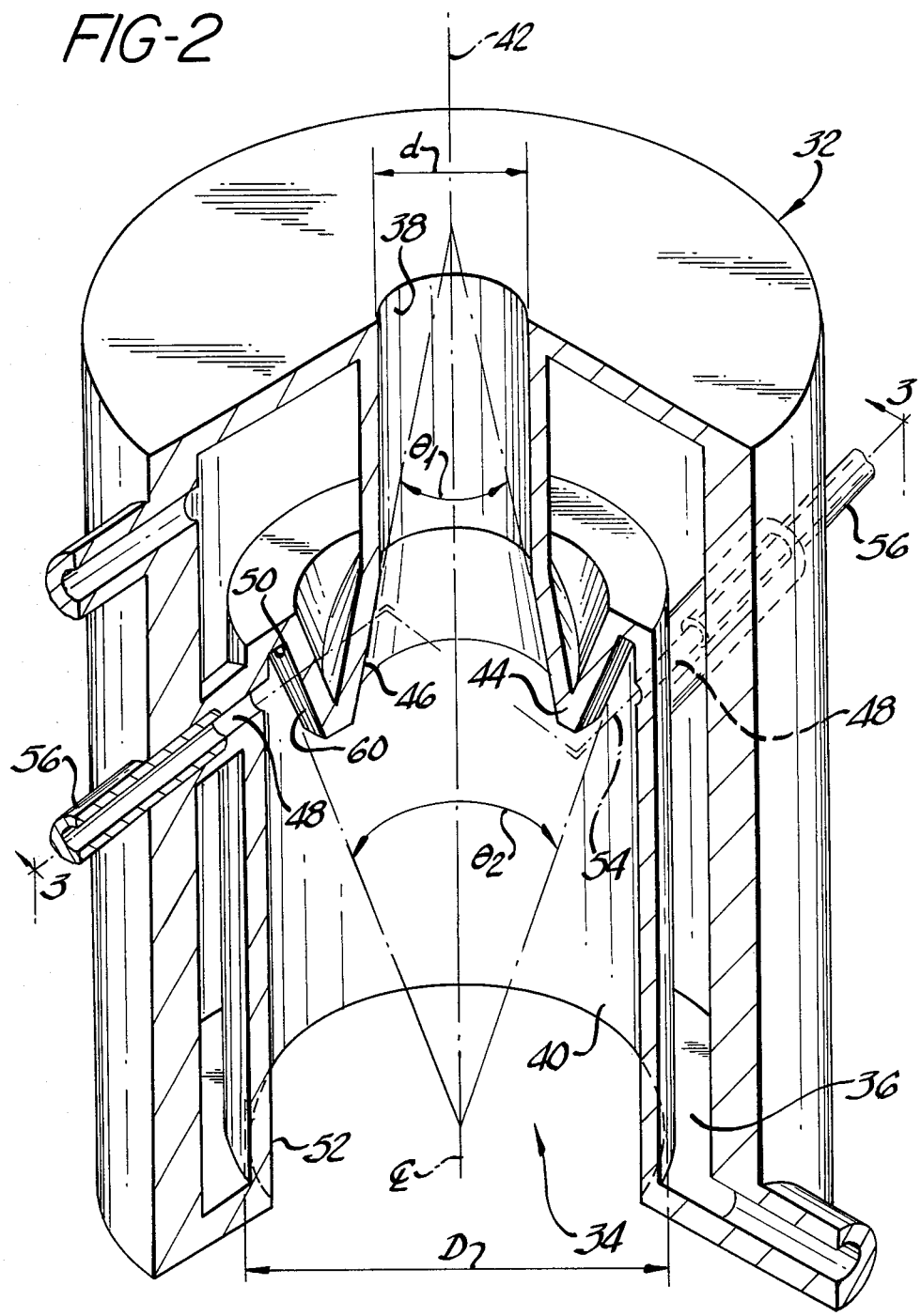
FIG. 2 is a schematic representation of the improved feed means of the present invention.

One improvement of the present invention relates to the feed means 24. The feed means 24 of the present invention is illustrated in FIG. 2. The feed means 24 has a liquid cooled injection ring 32, having a cylindrical passage 34 therethrough. A cooling channel 36 is provided. The cylindrical passage 34 has a first section 38 with a first diameter d and a second section 40 which joins the first section 38. The second section 40 has a second diameter D which is greater than the diameter d, of the first section 38. The first section 38 and the second section 40 have a common axis 42.

A radiation barrier 44 generated about the common axis 42 has an inner surface of revolution 46 which extends the first section 38 of the passage 34 into the second section 40 of the passage 34.

One or more reactant feed ports 48 are provided to supply reactants to the passage 34 of the injection ring 32. These reactant feed ports 48 pass through the injection ring 32 terminating in the second section 40 of the passage 34. The reactant feed ports 48 are located in close proximity to the junction 50 of the second section 40 and the first section 38 of the passage 34. It is preferred that the reaction feed ports 48 intersect the cylindrical surface 52 of the second passage 40 tangentially so as to minimize the abrasion of the surface by the reactants. This preferred configuration is illustrated in FIG. 3.

It is also preferred that the axis 54 of the reactant feed ports 48 be substantially normal (i.e., within about 10° to the common axis 42 of the first section 38 and the second section 40.

Water cooled feeder tubes 56 which are fitted to the reactant feed ports 48 and terminate prior to the cylindrical surface 52 of the second passage 40 are preferably employed.

Figure 3:
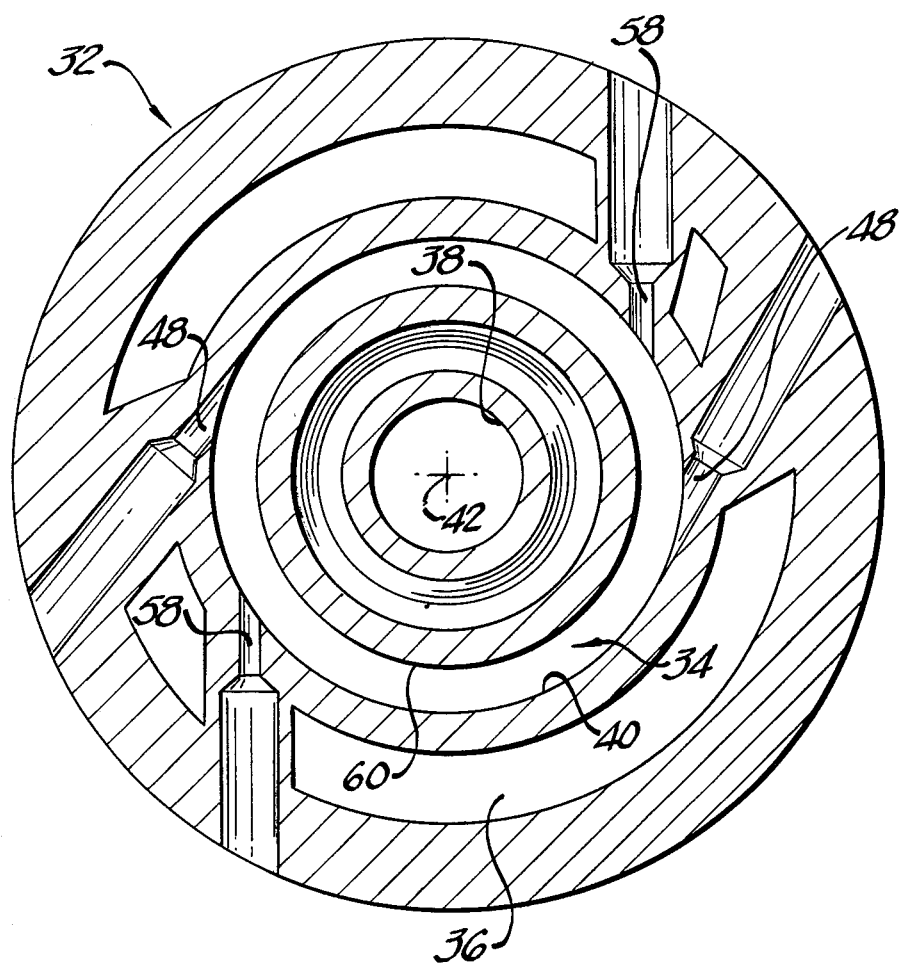
FIG. 3 is a cross section AA of FIG. 2 with feed tubes removed.

It is also preferred that associated ports 58 shown in FIG. 3 are provided in the injection ring when low melting reactants are employed. These associated ports 58 are coplanar with the reactant feed ports 48 and so positioned that the projection of the cross-section of the reaction feed port 48 and the projection of the cross-section of the associated ports 58 superimpose.

It is further preferred that the inner surface 46 of the radiation barrier 44 be conical. The apex angle $\theta_1$ of the cone should be between 20° and 40° and that the inner surface 46 diverges as the distance from the first section 38 increases. If the apex angle increases beyond 40°, the gas flow through the radiation shield will be turbulent. This turbulent flow will tend to cause back flow of reactor gases into the radiation barrier 44 and make plugging more likely. As the apex angle approaches 0°, the gas passing through the radiation barrier 44 is limited to the sonic velocity. Since the extension of the arc 20 is proportional to the velocity of the gas passing through the radiation barrier 44, the arc 20 efficiency is maximized when the conical surface has the included angle $\theta_1$ for its apex between about 20° and 40°.

The outer surface 60 of the radiation barrier 44 is preferably conical having a slope opposite to the inner surface 46 and an apex angle $\theta_2$. This facilitates fabrication of the structure and subsequent cleaning of the port area.

Figure 4:
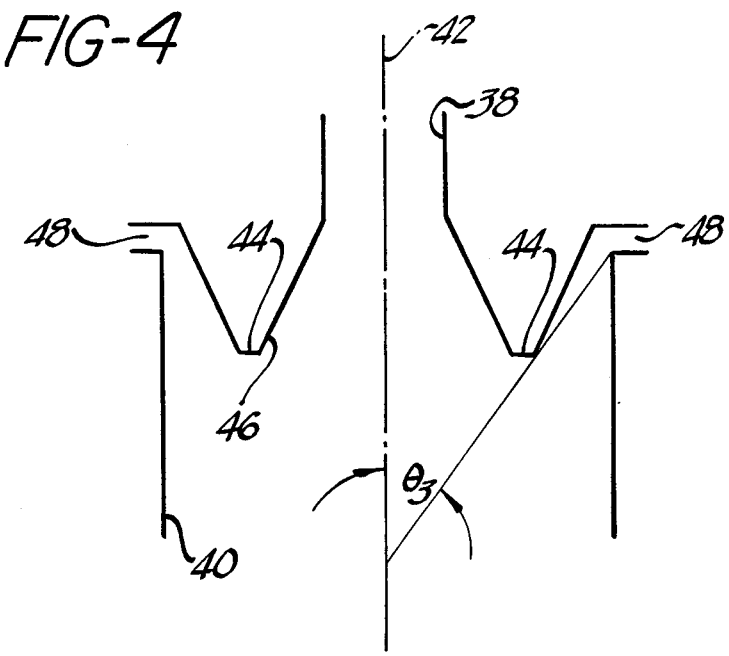
FIG. 4 illustrates the dependence of the view angle on the geometry of the injection ring and the radiation barrier.
Figure 5:
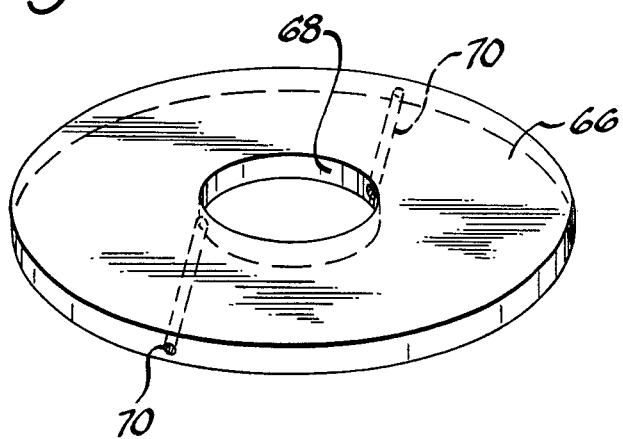
FIG. 5 is a schematic representation of a swirl gas ring of the present invention which is preferably used with the injection ring.

The extension of the outer conical surface 60 into the second section 40 of the passage 34 should be such that the line of sight from the common axis 42 to the feed ports 48 forms a view angle $\theta_3$ as illustrated in FIG. 4 with the arctan $\theta_3$ less than or equal to one. Limiting the line of sight as set forth above will preclude the feed ports 48 from viewing the hottest portion of the plasma. A preferred feature of the present invention to be employed in conjunction with the injection ring 32 is a swirl gas ring 66 which is attached to the injection ring 32. Referring to FIG. 5 the swirl gas ring 66 has a central passage 68 which is coaxial with the first passage 38 of the water cooled injection ring 32. The diameter of the central passage 68 should be greater than or equal to the diameter d of the first passage 38 of the injection ring 32. Swirl gas passages 70 tangentically intesect the cylindrical passage 68, thereby creating a vortex flow in the central passage 68 and assisting in further constricting the arc 20.

The apparatus described above is particularly well suited for reduction of low melting reactants such as boride ores including borax, colemanite, priceite, and meyerhofferite and refine boron ores such as boron oxide and boric oxide.

When these boron bearing oxides are mixed in iron and/or iron oxides such as ferric oxide and ferrous oxide and reacted with carbon bearing materials such as petroleum coke and carbon black, ferroboron is produced.

In general the mixture of the reactants is in stoichiometric ratios; and if non-stoichiometric the mixture should have an excess of iron or iron bearing oxides.

In order to illustrate the method of operation for the apparatus of the present invention, the following examples are offered.

EXAMPLE 1

Boron oxide $B_2O_3$ was reduced in a plasma torch system similar to that of FIG. 1 employing the injection ring illustrated in FIG. 2 and the swirl ring illustrated in FIG. 5. The apex angle $\theta_1$ for the inner surface of the radiation barrier was 40°. The apex angle $\theta_2$ of the outer conical surface was 30° and the view angle $\theta_3$ was such that arctan $\theta_3 = 1$. The swirl ring passage was greater than the diameter d of the first section but less than the diameter D of the second section.

The torch used was a nominal 40 kilowatt torch to process 2.32 kilograms/hr (5.10 lbs/hr) of a stoichiometric blend containing 51.4 wt % iron, 32.0 wt % boric oxide and 16.6 wt % petroleum coke. The stabilizing gas was argon which was supplied at the rate of 224 SCFH with approximately equal portions being supplied to the plasma feed gas and the swirl ring. Helium was the feed gas amd was supplied at 236 SCFH.

The powder was pneumatically conveyed through the feed port using argon at 50 SCFH. Argon was also passed through the associated ports at 24 SCFH. The superficial injection velocities used for all ports was 150 ft/sec. The particle size for the powder was selected such that the largest particles had a diameter less than 1/5 the diameter of the feed port. During operation a current of 380 amperes and a voltage of 106 volts was established. A ferroboron alloy containing 10% boron was produced at a rate of 1.14 kg/hr (2.5 lbs/hr).

EXAMPLE 2

The torch setup described for Example 1 was used to convert 2.85 kg/hr (6.27 lbs/hr) of a stoichiometric reaction blend of 41.2 wt % iron, 45.5 wt % boric acid and 13.3 wt % petroleum coke. The resulting current was 370 amperes and the voltage was 108 volts. A ferroboron alloy containing 5.1% boron was produced at a rate of 1.3 kg/hr (2.87 lbs/hr).

EXAMPLE 3

The torch setup described for Example 1 was used to convert 2.08 kg/hr (4.59 lbs/hr) of a stoichiometric blend consisting of 51.4 wt % iron, 32.0 wt % boric oxide and 16.6 wt % carbon black. The stabilized arc resulted in a current of 380 amperes with a voltage drop of 105 volts. A ferroboron alloy containing 8.8 wt % boron was produced at a rate of 1.05 kg/hr (2.3 lbs/hr).

We claim:

1. An improved plasma reactor of the falling film type, the improvement comprising
   (a) a water cooled injection ring having a cylindrical passage therethrough, said passage having a first section with a first diameter joining a second section with a second diameter greater than said first diameter, said first and second sections having a common axis;
   (b) a radiation barrier generated about said common axis having an inner surface of revolution which extends said first section of said passage into said second section;
   (c) one or more reactant feed ports passing through said injection ring terminating in said second section in close proximity to the junction with said first section.

2. The plasma reactor of claim 1 wherein all said reactant feed ports tangentically intersect said second passage.

3. The plasma reactor of claim 2 further comprising:

water cooled feeder tubes for said reactant feed ports, said feeder tubes being fitted to said reactant feed ports extending therein but terminating prior to said second section of said cylindrical passage.

4. The plasma reactor of claim 3 wherein each of said reactant feed ports has an axis, said axis being within about 10° to normal of said common axis of said first and second sections of said passage.

5. The plasma reactor of claim 4 wherein said inner surface of revolution is conical with an apex angle between 20° and 40°.

6. The plasma reactor of claim 5 wherein said radiation barrier has an outer surface of revolution which is conical.

7. The plasma reactor of claim 6 wherein all of said reactant feed ports have an associated port in said injection ring said associated ports positioned such that projection of the cross-section of said reactant feed port and the projection of the cross-section of said second port superposition.

8. The reactor of claim 7 wherein said radiation barrier extends into said second section to provide a view angle $\theta_3$ between said common axis and said feed ports such that arctan $\theta_3 \leq 1$.

* * * * *